(12) United States Patent
Katz

(10) Patent No.: US 6,791,197 B1
(45) Date of Patent: Sep. 14, 2004

(54) REDUCING LAYER SEPARATION AND CRACKING IN SEMICONDUCTOR DEVICES

(75) Inventor: Anne T. Katz, Santa Clara, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 175 days.

(21) Appl. No.: 10/227,772

(22) Filed: Aug. 26, 2002

(51) Int. Cl.[7] .................. H01L 29/40; H01L 23/544
(52) U.S. Cl. .................. 257/786; 257/781; 257/48; 257/620
(58) Field of Search ................ 257/786, 781, 257/48, 620

(56) References Cited

U.S. PATENT DOCUMENTS

| | | | |
|---|---|---|---|
| 5,616,931 A | * | 4/1997 | Nakamura et al. ............. 257/48 |
| 5,725,740 A | | 3/1998 | Raaijmakers |
| 5,844,168 A | * | 12/1998 | Schueller et al. ........... 174/52.4 |
| 5,923,047 A | * | 7/1999 | Chia et al. ..................... 257/48 |
| 6,049,124 A | * | 4/2000 | Raiser et al. ................ 257/712 |
| 6,153,521 A | | 11/2000 | Cheung et al. |
| 6,261,953 B1 | | 7/2001 | Uozumi |
| 6,566,740 B2 | * | 5/2003 | Yasunaga et al. ........... 257/670 |
| 2003/0094966 A1 | * | 5/2003 | Fang ......................... 324/765 |

FOREIGN PATENT DOCUMENTS

| | | | | |
|---|---|---|---|---|
| JP | 62-106638 | * | 5/1987 | ................. 257/786 |

* cited by examiner

*Primary Examiner*—Jasmine Clark
(74) *Attorney, Agent, or Firm*—Glass & Associates; Kenneth Glass

(57) ABSTRACT

An apparatus and a method for reducing layer separation and cracking in semiconductor devices. A structure is formed over a semiconductor wafer that includes die separated by scribe streets and that includes probe pads for testing die. A notch is cut within a scribe street so as to expose an open area that does not contain any probe pad and that does not contain any metal layers. The wafer is then severed into semiconductor devices by extending a cutting blade through the open area. A semiconductor device is then electrically and physically coupled to a ball grid array substrate to form a ball grid array device having reduced layer separation and cracking.

19 Claims, 11 Drawing Sheets

REDUCING LAYER SEPARATION AND CRACKING IN SEMICONDUCTOR DEVICES

FIELD OF THE INVENTION

The present invention relates to the field of semiconductor devices. More specifically, the present invention relates to an apparatus and method for reducing layer separation and cracking in semiconductor devices.

BACKGROUND ART

In conventional semiconductor device fabrication processes, probe pads are used for electrically testing individual die. These probe pads are typically located within scribe streets that extend between individual die. However, when probe pads are located in scribe streets that are narrow, the probe pads and the underlying metal layers that couple to the probe pads can be cut by the sawing process that is used for separating the die.

When the probe pads and the underlying metal layers are cut by the sawing process, layer separation and cracking can result. More particularly, the upward movement of the back of the blade exerts a force against the probe pads and the underlying metal layers that can cause the probe pads and/or the underlying metal layers to separate or crack.

The layer separation and/or cracks often do not extend beyond the scribe street area, leaving the inner part of the die intact. However, subsequent process steps can cause the layer separation and/or the cracks to propagate into the inner part of the die. When the layer separation and/or the cracks propagate into the inner part of the die, device failure can result.

The subsequent process steps for forming a ball grid array device can cause the layer separation and/or the cracks to propagate into the inner part of the die. For example, process steps that apply stress to the die, such as steps in which the die is handled, can cause the layer separation and/or cracks to propagate into the inner part of the die. Also, process steps that include heating (e.g., wire bonding processes and adhesive curing processes) can cause the layer separation and/or the cracks to propagate into the inner part of the die.

In addition, the layer separation and/or the cracks can propagate during reliability test procedures. This can cause reliability-test failures. These reliability-test failures indicate likely failure during subsequent operation and usage of the device.

Thus, there is a need for a semiconductor device and a method for forming a semiconductor device having reduced layer separation and cracking. In addition, there is a need for a ball grid array device and a method for forming a ball grid array device having reduced layer separation and cracking. The present invention meets the above needs.

DISCLOSURE OF THE INVENTION

The present invention provides a semiconductor device and a method for forming a semiconductor device having reduced layer separation and cracking. In addition, the present invention provides a ball grid array device and a method for forming a ball grid array device having reduced layer separation and cracking. By reducing layer separation and cracking, a semiconductor device and a ball grid array device are obtained that have fewer device failures and fewer reliability problems.

A method for forming a semiconductor device in which layer separation and cracking is reduced is disclosed. A structure is formed over a semiconductor wafer that includes die separated by scribe streets and that includes probe pads for testing die. These probe pads are electrically coupled to the die by metal layers that at least partially underlie the probe pads. A notch is cut within a scribe street using a first cutting blade having cutting surfaces disposed at an acute angle relative to the center axis of the cutting blade. This removes portions of at least some of the probe pads and removes portions of at least some of the underlying metal layers so as to expose an open area that does not, contain any remaining portion of the probe pads and that does not contain any remaining portion of the metal layers. Because the cutting surfaces are disposed at an acute angle, less vertical force is applied by the rear edge of the cutting blade. Accordingly, less separation and cracking results.

The wafer is then severed by extending a second cutting blade into the open area. Because the wafer is severed within the open area, the second cutting blade does not contact any remaining portion of a probe pad or any remaining portion of a metal layer. Therefore, layer separation and cracking does not occur during the severing process. Accordingly, the present method produces a semiconductor device having reduced layer separation and cracking.

Also, a method for forming a ball grid array device is disclosed. First, a semiconductor device is formed in accordance with the method for forming a semiconductor device in which layer separation and cracking is reduced. The semiconductor device is attached to a ball grid array package substrate using adhesive. Wire bonds are coupled to the semiconductor device and are coupled to the ball grid array package substrate so as to electrically couple the semiconductor device to the ball grid array package substrate. Encapsulant is then disposed over the ball grid array package substrate and is cured to complete the ball grid array device.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
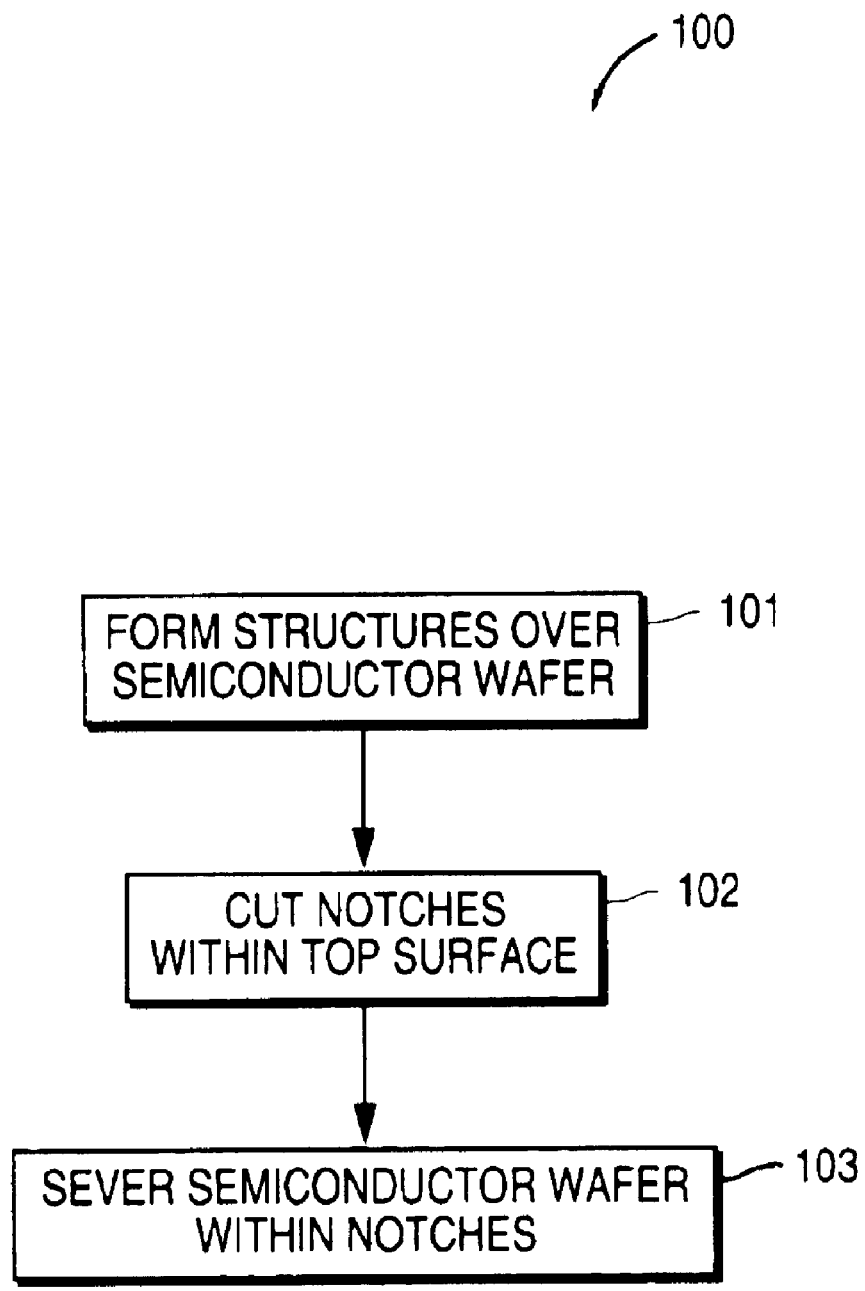
FIG. 1 is a flow chart that illustrates a method for forming a semiconductor device in which layer separation and cracking is reduced in accordance with one embodiment of the present invention.

FIG. 1 illustrates a method 100 for forming a semiconductor device in which layer separation and cracking is reduced. As shown by step 101 structures are formed over a semiconductor wafer. These structures include die and scribe streets. In the present embodiment, each die is bounded on all sides by scribe streets.

Continuing with step 101 of FIG. 1, the structures formed in step 101 also include probe pads for testing each die. In the present embodiment, the number of die is maximized by using narrow scribe streets and by forming probe pads within scribe streets. In one embodiment, the scribe streets are so narrow that cuts cannot be made along individual scribe streets without also cutting through at least some probe pads.

Figure 2:
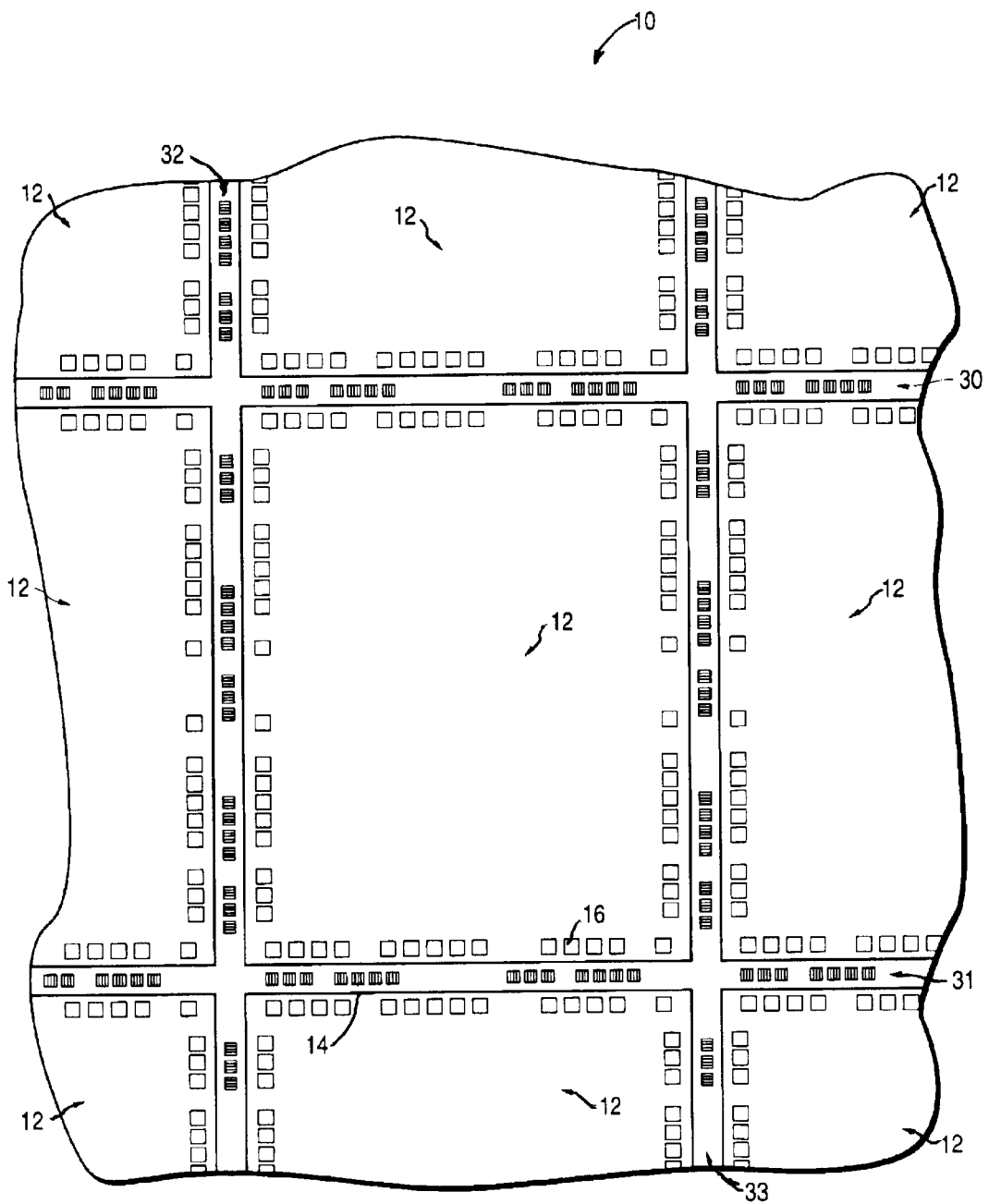
FIG. 2 shows a top view of a portion of a semiconductor wafer that includes die that are separated by scribe streets and that includes probe pads in accordance with one embodiment of the present invention.

FIG. 2 shows an exemplary structure formed over semiconductor wafer 10 in accordance with step 101 of FIG. 1. Semiconductor wafer 10 includes die 12 and scribe streets 30–33. Scribe streets 30–33 extend between die 12 and separate individual die 12. The structures also include probe pads 14 which extend within scribe streets 30–33. Bonding pads 16 are disposed within the top surface of each of die 12.

Figure 3:
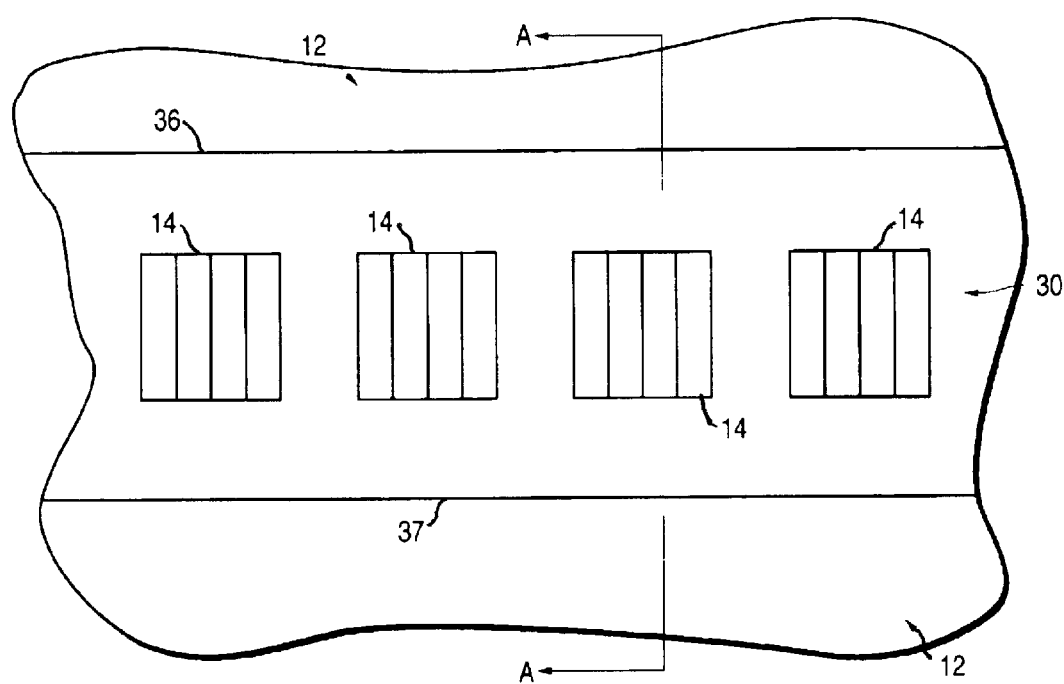
FIG. 3 is an expanded top view of a portion of the structure of FIG. 2 in accordance with one embodiment of the present invention.

FIG. 3 shows scribe street 30 to extend between die 12. Lines 36–37 illustrate the boundaries of scribe street 30. It is appreciated that lines 36–37 are for illustrative purposes, and that the boundaries of scribe streets may or may not be visible on the top of any particular semiconductor wafer.

Figure 4:
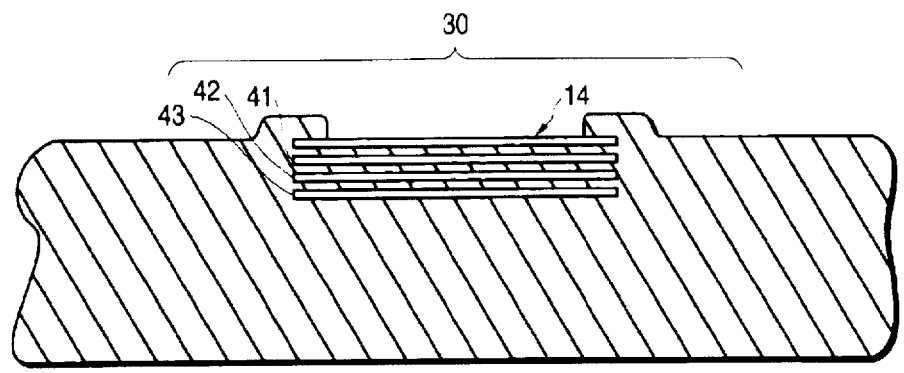
FIG. 4 illustrates a cross-sectional view along cross section A—A of FIG. 3 in accordance with one embodiment of the present invention.

Referring now to FIG. 4, metal layers 41–43 extend below each probe pad 14. In the present embodiment, metal layers 41–43 electrically couple probe pads 14 with the internal circuitry of die 12. Though the present embodiment is shown to have three metal layers 41–43, alternatively, more or fewer metal layers could be used.

In one embodiment of the present invention die 12 are tested using probe pads 14. Testing is completed prior to performing step 102 of FIG. 1.

As shown by step 102 of FIG. 1, a first cut is made so as to cut notches within the top surface. In the present embodiment, notches are cut within each scribe street using a cutting blade having cutting surfaces that are disposed at an acute angle relative to the center axis of the cutting blade. By using a cutting surface that is disposed at an acute angle relative to the center axis of the cutting blade, material is removed from the top surface of the wafer without separating or cracking of probe pad or metal layers.

Continuing with step 102, this first cut removes a portion of each probe pad and removes a portion of each of the underlying metal layers so as to form an open area. This open area does not contain any remaining portion of a probe pad and does not contain any remaining portion of a metal layer.

Figure 5A:
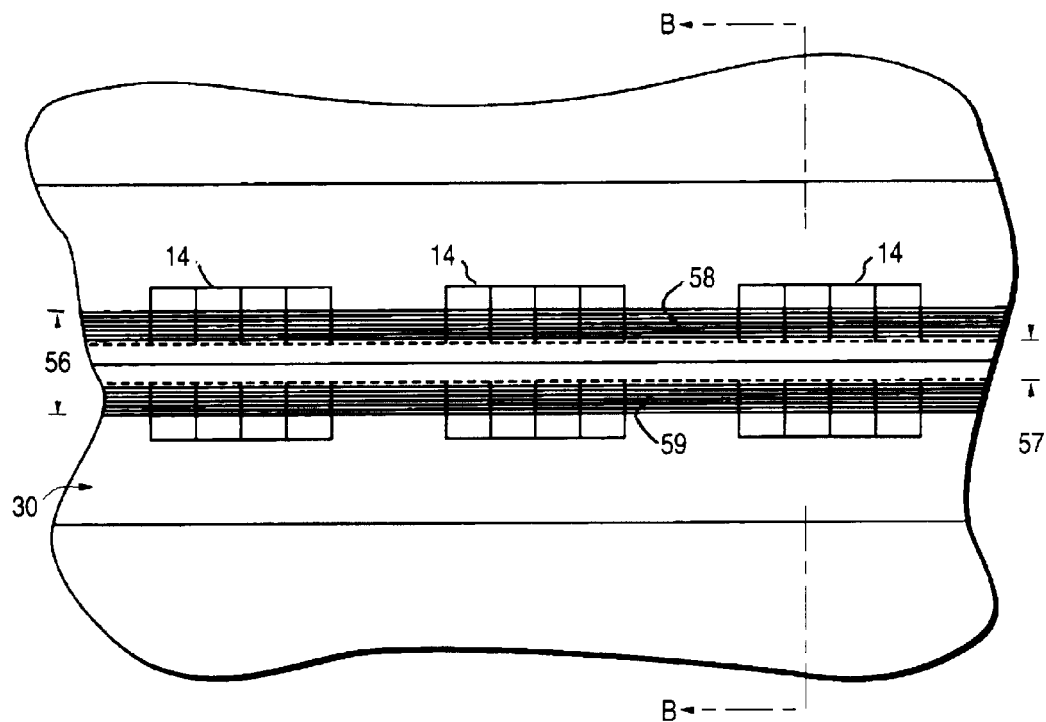
FIG. 5A shows the view of FIG. 3 after step 102 of FIG. 1 has been performed in accordance with one embodiment of the present invention.

FIG. 5A shows the structure of FIG. 3 after notch 56 has been cut along scribe street 30. Notch 56 is cut deep enough to expose an open area 57 within the scribe street that does not contain any probe pads, and that does not contain any metal layers.

Figure 5B:
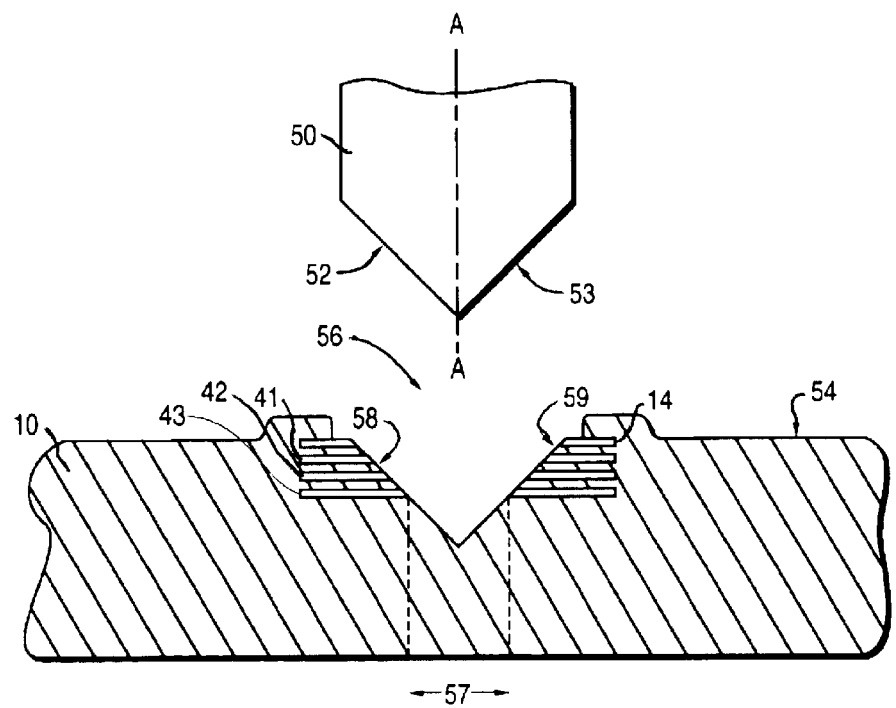
FIG. 5B illustrates a cross-sectional view along cross section B—B of FIG. 5A and illustrates an exemplary cutting blade that can be used in accordance with one embodiment of the present invention.

In the embodiment shown in FIG. 5B, blade 50 is used to cut notch 56. Blade 50 includes cutting surfaces 52–53. Cutting surface 52 is disposed at a forty-five degree angle with respect to center axis A—A of blade 50. Similarly, cutting surface 53 is disposed at an angle of forty-five degrees with respect to center axis A—A of blade 50. Thus, both cutting surface 52 and cutting surface 53 are disposed at an acute angle with respect to the center axis A—A of blade 50.

Continuing with FIG. 5B, notch 56 includes side surface 58 and side surface 59. Both side surface 58 and side surface 59 are beveled with respect to top surface 54 of wafer 10. In the present embodiment side surfaces 58–59 are disposed at an angle of forty-five degrees with respect to top surface 54. It can be seen that angled cutting surfaces 52–53 have removed some of probe pad 14 and have removed some of each of metal layers 41–43 so as to expose an open area 57 that does not contain any probe pad 14 and that does not contain any metal layers 41–43. The open area 57 extends from notch 56 completely through wafer 10. No remaining portion of a probe pad and no remaining portion of a metal layer extends within open area 57.

During the cutting process, the rear of cutting blade 50 applies a force at an angle that is not orthogonal to the top surface of the wafer. This results in less vertical force being applied to probe pad 14 and to metal layers 41–43. Accordingly, less separation and cracking results as compared with prior art methods that use conventional straight cutting blades.

Though FIG. 5B shows a cutting blade having cutting surfaces disposed an angle of forty-five degrees, the cutting surfaces could be thirty degrees, sixty degrees, or any other acute angle. It has been found that cutting blades having an angle of forty-five degrees, thirty degrees, and sixty degrees work well for reducing layer separation and cracking.

Figure 5C:
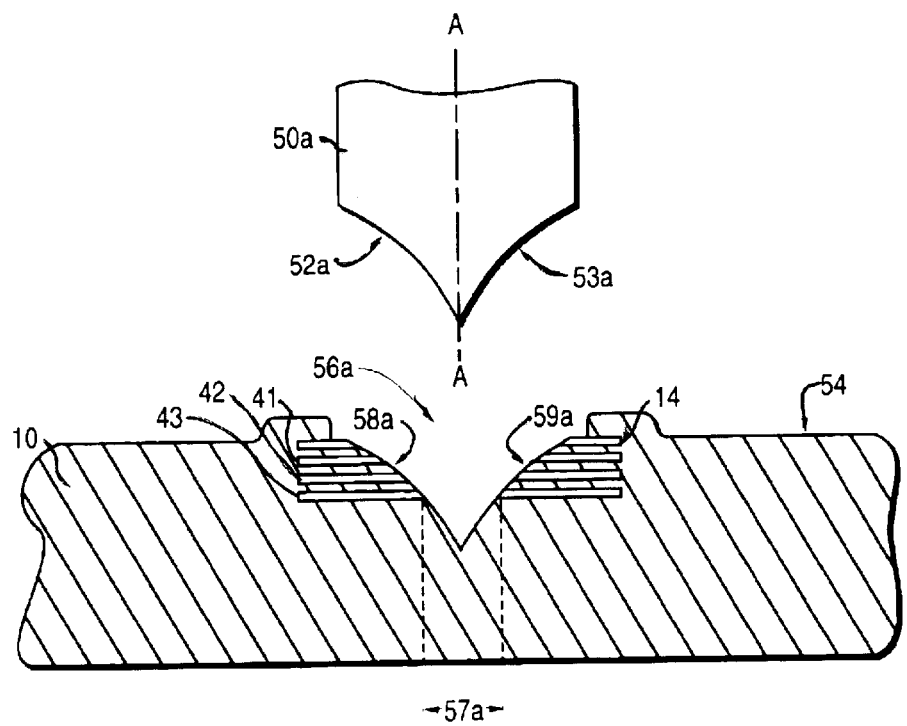
FIG. 5C illustrates a cross-sectional view along cross section A—A of FIG. 3 after step 102 of FIG. 1 has been performed using a cutting blade having curved cutting surfaces and illustrates an exemplary cutting blade having curved cutting surfaces in accordance with one embodiment of the present invention.

In addition to cutting blades having planar cutting surfaces, other shapes of cutting surfaces can be used. FIG. 5C shows an example of a cutting blade 50a having curved cutting surfaces 52a and 53a that are disposed at an acute angle relative to the center axis A—A of cutting blade 50a. This produces a notch 56a having side surfaces 58a–59a that are curved. This forms open area 57a within notch 56a and within scribe street 30. It can be seen that open area 57a does not contain any remaining portion of probe pad 14 and does not contain any remaining portion of metal layers 41–43.

Referring now to step 103 of FIG. 1, the wafer is then severed within the notches. In the present embodiment, a second cut is made within the notches formed in step 102. This second cut extends completely through the wafer. Thereby the wafer is separated into individual semiconductor devices. In the present embodiment, the wafer is severed within the open area that does not contain any probe pad and that does not contain any metal layers. Thereby the cutting blade that is used to sever the wafer does not contact any probe pad or any metal layer. Accordingly, the severing process does not cause separation and cracking to occur.

Figure 6A:
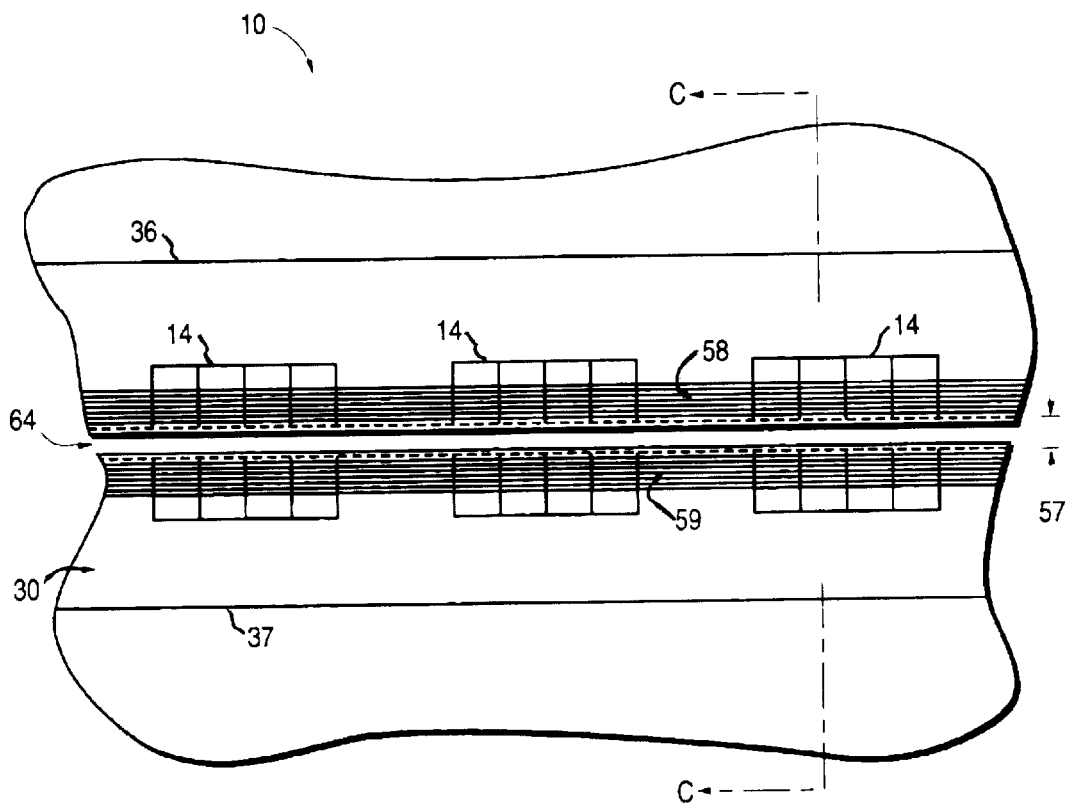
FIG. 6A shows the view of FIG. 5A after step 103 of FIG. 1 has been performed in accordance with one embodiment of the present invention.
Figure 6B:
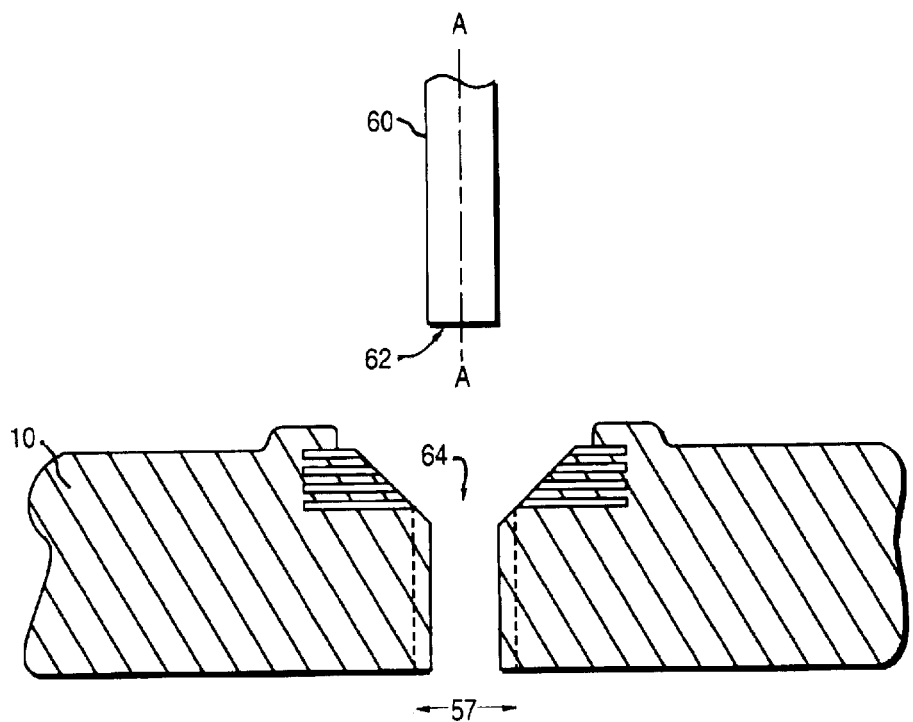
FIG. 6B illustrates a cross-section view along cross section C—C of FIG. 6A and illustrates an exemplary cutting blade that can be used for performing step 103 of FIG. 1 in accordance with one embodiment of the present invention.

FIG. 6A shows the structure of FIG. 5A after step 103 has been performed so as to form cut 64. Cut 64 is shown to extend completely through semiconductor wafer 10 and to extend entirely within open area 57, In the present embodiment which is shown in FIG. 6B, a straight cutting blade 60 is used in step 103 for cutting wafer 10. Cutting blade 60 has a cutting surface 62 disposed at an angle of 90 degrees relative to the center axis A—A of cutting blade 60. It can be seen that the cutting blade 60 cuts entirely within open area 57. Therefore, cutting blade 60 does not contact any remaining portion of probe pads 14 or any remaining portion of metal layers 41–43 during the cutting process. Accordingly, separation and cracking does not occur.

In one embodiment, the cutting blade used to perform step 102 and the cutting blade used to perform step 103 are rotary cutting blades that are aligned such that step 102 and step 103 are performed sequentially in a single pass. More particularly, the two cutting blades are aligned such that, in a single pass of the wafer past the two cutting blades, both the notch is formed and the wafer is severed. This process is repeated for each scribe street until the wafer has been completely severed into individual semiconductor devices.

Figure 7:
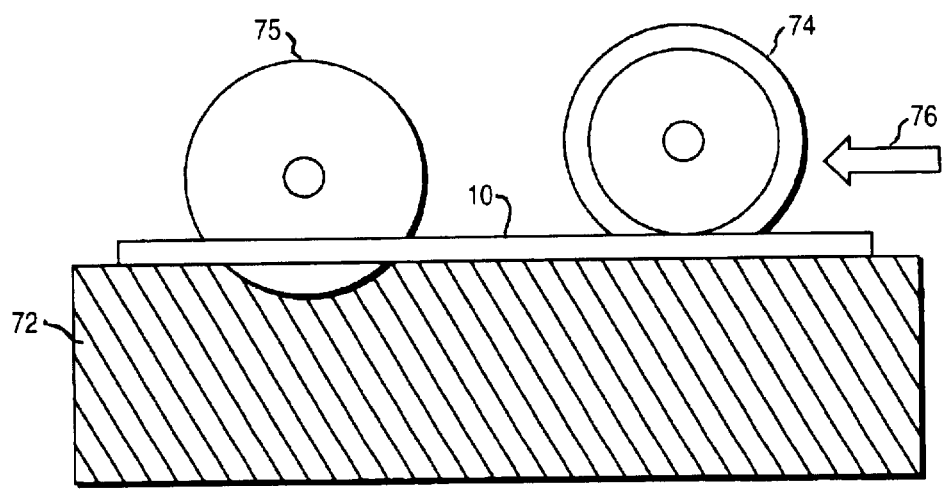
FIG. 7 shows a semiconductor wafer disposed on a chuck table and illustrates exemplary cutting blades that can be used for performing steps 102 and 103 of FIG. 1 in accordance with one embodiment of the present invention.

FIG. 7 shows an exemplary chuck table 72 that can be used for cutting semiconductor wafer 10 in accordance with steps 102–103 of FIG. 1. A first cutting blade 74 and a second cutting blade 75 are disposed over chuck table 72. Cutting blade 74 includes cutting surfaces that are disposed at an acute angle with respect to the center axis of cutting blade 74. Cutting blade 75 is a straight blade that includes a cutting surface disposed at a ninety degree angle with respect to the center axis of cutting blade 75.

Continuing with FIG. 7, in the present embodiment, cutting blade 74 and cutting blade 75 are not aligned vertically. Rather, cutting blade 74 is aligned so as to only partially cut through the top surface of semiconductor wafer 10 while cutting blade 75 is vertically aligned so as to completely cut through semiconductor wafer 10. In the present embodiment, cutting blade 74 is disposed vertically so as to cut a notch within semiconductor wafer 10 that is sufficiently deep so as to expose an open area that is sufficiently wide for cutting blade 75 to penetrate. In one embodiment, semiconductor wafer 10 has a thickness of 0.343 millimeters and cutting blade 74 is a v-shaped blade that is vertically aligned so as to cut to a depth of 1.24 mils from top surface 54 shown in FIGS. 5B–5C. In one embodiment, cutting blade 75 has a width of 1.08 mils.

In the present embodiment, deionized water is applied on or near cutting blade 74 and on or near cutting blade 75 so as to cool cutting blades 74–75 and minimize heating and friction during the cutting of substrate 10.

Continuing with FIG. 7, in the present embodiment, cutting blade 74 and cutting blade 75 are aligned in the same cutting plane. Thereby, cutting blades 74–75 cut a notch and subsequently sever the wafer within the notch. More particularly, as the semiconductor wafer 10 is moved as indicated by arrow 76, the first blade 74 cuts a notch within a particular scribe line. The second blade 75 then cuts completely through the wafer to sever the wafer within the notch. This allows each scribe street to be notched and severed in a single pass. However, it is appreciated that the first blade and the second blade could also be offset so as to cut a notch on a particular scribe street on a first pass and sever that particular scribe street on a subsequent pass.

Figure 8:
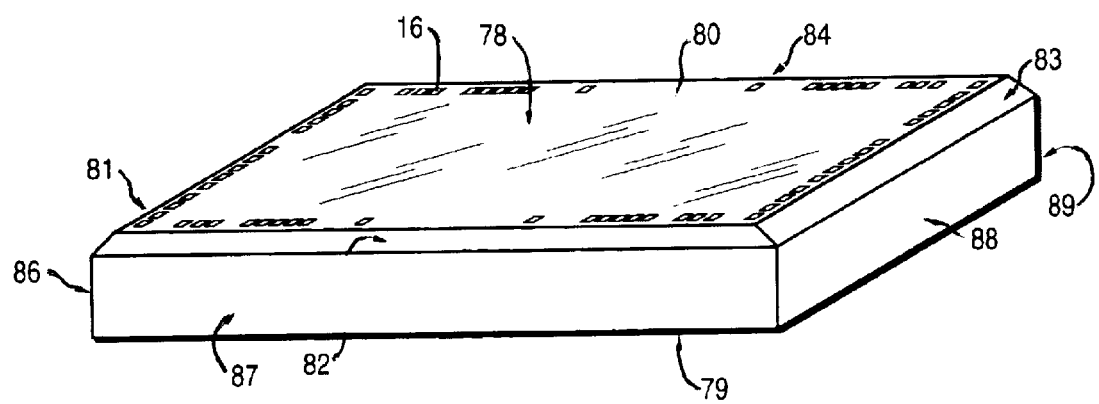
FIG. 8 shows a completed semiconductor device in accordance with an embodiment of the present invention.

FIG. 8 shows an exemplary semiconductor device 80 fabricated in accordance with steps 101–103 of FIG. 1. Semiconductor device 80 includes a top surface 78 within which bonding pads 16 are disposed. Each of the side surfaces of semiconductor device 80 includes a beveled surface 81–84 that adjoins top surface 78. Each side surface also includes a non-beveled surface 86–89. Non-beveled surface 86 extends from the lower edge of beveled surface 81 to bottom surface 79. Non-beveled surface 87 extends from the lower edge of beveled surface 82 to bottom surface 79. Similarly, non-beveled surface 88 extends from the lower edge of beveled surface 83 to bottom surface 79, and non-beveled surface 89 extends from the lower edge of beveled surface 84 to bottom surface 79

Because beveled surfaces 81–84 extend completely through probe pads 14 shown in FIGS. 2–6B, any exposed remaining portion of a probe pad will be disposed within one of beveled surfaces 81–84. Similarly, because beveled surfaces 81–84 extend completely through metal layers 41–43 shown in FIGS. 4–6B, any exposed remaining portion of metal layers 41–43 will extend within beveled surfaces 81–84. Thus, no remaining portion of either a probe pad 14 or a metal layer 41–43 will extend within any of non-beveled surfaces 86–89.

Figure 9:
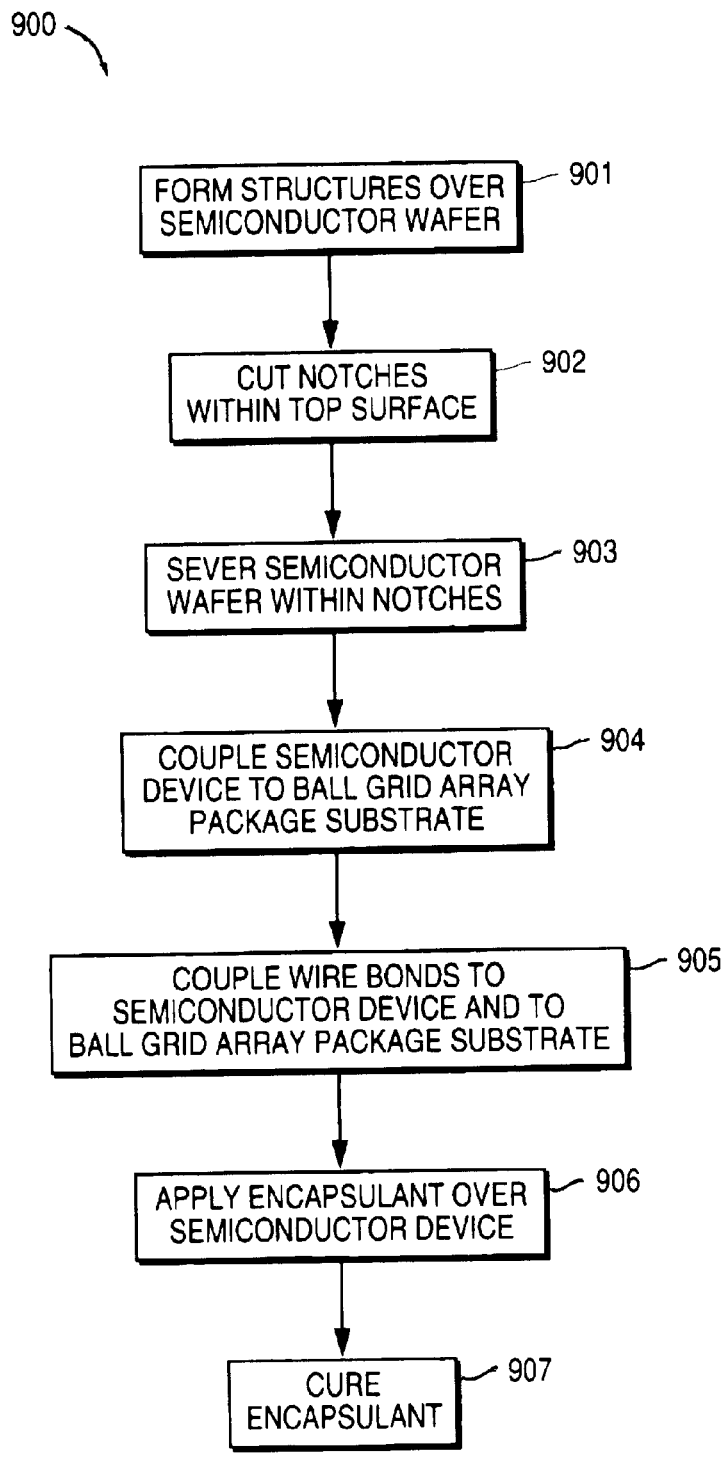
FIG. 9 is a flow chart that illustrates a method for forming a ball grid array device in accordance with one embodiment of the present invention.

FIG. 9 illustrates a method 900 for forming a ball grid array device having reduced layer separation and cracking. First a semiconductor device is formed as shown by steps 901–903. More particularly, structures are formed over a semiconductor wafer (step 901), notches are cut (step 902), and the wafer is severed within the notches (step 903). In the present embodiment, the semiconductor device is formed in the same manner as is illustrated in FIGS. 1–8.

Referring now to step 904, the semiconductor device is coupled to a ball grid array package substrate. In the present embodiment the semiconductor device is coupled to the ball grid array package substrate using adhesive.

Figure 10:
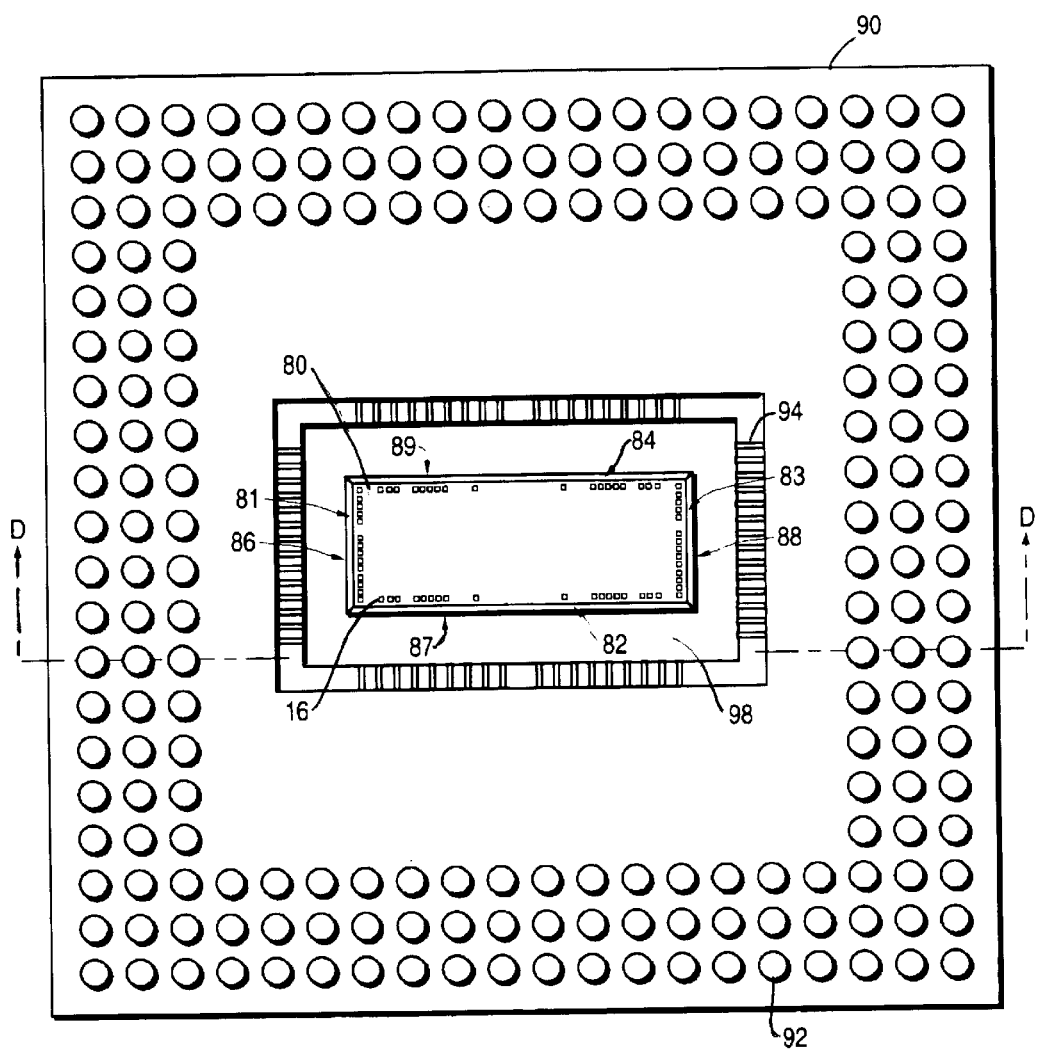
FIG. 10 is a top view of a semiconductor device disposed over a ball grid array package substrate in accordance with one embodiment of the present invention.
Figure 11:
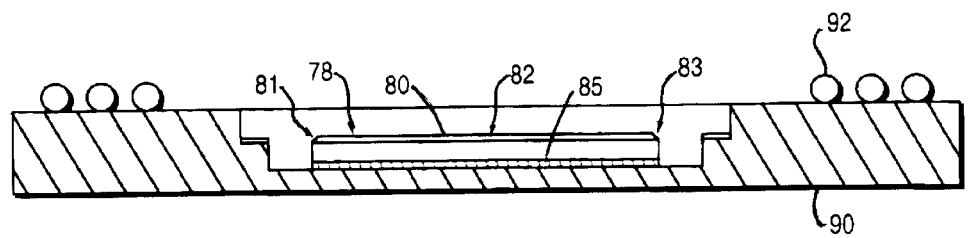
FIG. 11 is a cross-sectional view of the structure of FIG. 10 along cross section D—D in accordance with one embodiment of the present invention.

FIGS. 10–11 show semiconductor device 80 that is coupled to ball grid array package substrate 90 in accordance with step 904 of FIG. 9. In the present embodiment, ball grid array package substrate 90 includes a ball grid array of solder balls 92. Ball grid array package substrate 90 also includes bonding pads 94 shown in FIG. 10 that couple to solder balls 92. Solder balls 92 are shown to be disposed on the top surface of ball grid array package substrate 90. However, it is appreciated that solder balls 92 could also be disposed along the bottom surface of ball grid array package substrate 90.

Referring now to FIG. 11, only adhesive 85 extends between bottom surface 79 shown in FIG. 8 and that portion of the top surface of ball grid array package substrate 90 to which semiconductor device 80 is affixed. In the present embodiment, adhesive 85 is cured by performing a heating process step. Because the semiconductor device has little, if any layer separation and cracking as a result of steps 902–903, there is little, if any, propagation during step 904. More particularly, the forces related to applying adhesive, pressing the semiconductor device against the ball grid array package substrate, and the heat curing process do not result in device failure as there are few, if any separated layers and/or cracks to propagate.

Wire bonds are coupled to the semiconductor device and are coupled to the ball grid array package substrate as is shown by step 905 of FIG. 9. The wire bonds electrically couple the semiconductor device to the ball grid array package substrate. In one embodiment, heat is applied so as to bond individual wire bonds to bonding pads.

Figure 12:
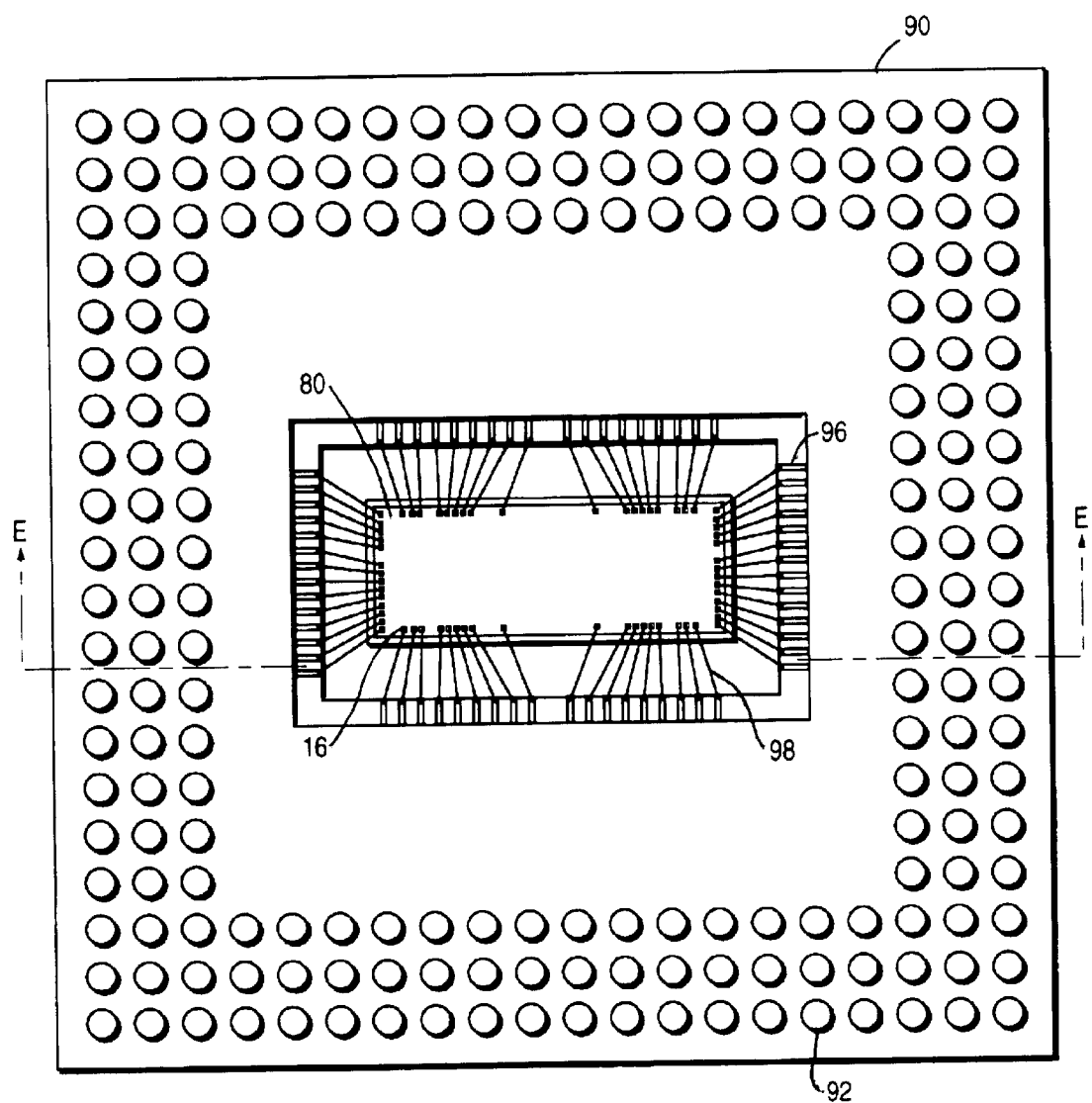
FIG. 12 is a top view of the structure of FIG. 10 after wire bonds have been coupled to the semiconductor device and to the ball grid array package substrate in accordance with one embodiment of the present invention.
Figure 13:
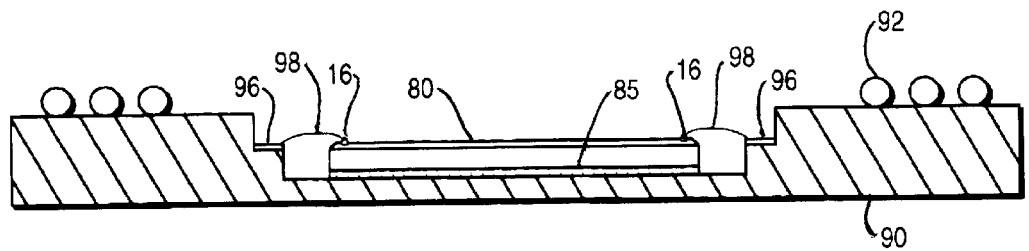
FIG. 13 is a cross-sectional view along cross section E—E of FIG. 12 in accordance with one embodiment of the present invention.

FIGS. 12–13 show an embodiment in which wire bonds 98 are used to couple bonding pads 16 of semiconductor device 80 to bonding pads 96 of ball grid array package substrate 90. Wire bonds 98 electrically couple the circuitry of semiconductor device 80 to solder balls 92.

Because there is little, if any, layer separation and cracking as a result of process steps 902–903, there is little, if any propagation during step 905 of FIG. 9. More particularly, the heat and pressure of the wire bonding process does not result in propagation of separated layers or cracks.

As shown by step 906 of FIG. 9, encapsulant is applied over the semiconductor device. In the present embodiment, liquid encapsulant is applied such that the encapsulant is disposed over the semiconductor device and disposed over the wire bonds.

As shown by step 907 the encapsulant is cured. In the present embodiment, the encapsulant is cured by performing a heating process step. Because the semiconductor device has little, if any layer separation and cracking as a result of steps 902–903, there is little, if any, propagation during the heating process step.

Figure 14:
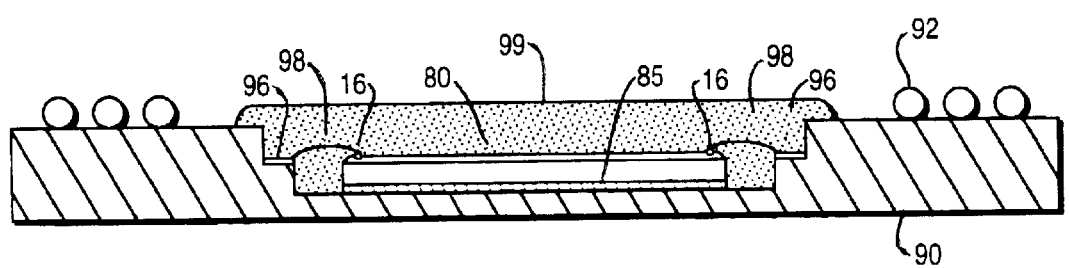
FIG. 14 shows the structure of FIG. 13 after encapsulant has been applied and cured in accordance with one embodiment of the present invention.

FIG. 14 shows the structure of FIG. 13 after encapsulant 99 has been applied and cured. Encapsulant 99 extends over and completely covers the top and side surfaces of semiconductor device 80. Also, encapsulant 99 extends over and completely covers wire bonds 98 and bonding pads 96. Encapsulant 99 insulates and protects semiconductor device 80, wire bonds 98 and bonding pads 96.

Method 900 results in a ball grid array device having reduced layer separation and cracking. More particularly, steps 901–903 result in a semiconductor device having reduced layer separation and cracking. Because there are few, if any occurrences of layer separation and cracking as a result of process steps 902–903, there is little, if any propagation into active areas of the die as a result of process steps 904–907. Accordingly, device failures are avoided and reliability is improved.

The preferred embodiment of the present invention is thus described. While the present invention has been described in particular embodiments, it should be appreciated that the present invention should not be construed as limited by such embodiments, but rather construed according to the following claims.

What is claimed is:

1. For a semiconductor wafer having a scribe street, having probe pads disposed within said scribe street, and having metal layers that at least partially underlie said probe pads, a method for forming a semiconductor device comprising:

cutting a notch within said scribe street using a first cutting blade having cutting surfaces disposed at an acute angle relative to the center axis of said cutting blade, said cutting surfaces removing portions of at least some of said probe pads and removing portions of at least some of said metal layers so as to expose an open area that does not contain any of said probe pads and that does not contain any of said metal layers; and severing said wafer by extending a second cutting blade into said open area.

2. The method for forming a semiconductor device of claim 1 wherein said first cutting blade and said second cutting blade are rotating cutting blades that are aligned in the same plane such that said cutting said notch and said severing said wafer are performed sequentially in a single pass.

3. The method for forming a semiconductor device of claim 2 wherein said cutting surfaces are disposed at an angle of forty-five degrees relative to a center axis of said first cutting blade.

4. A semiconductor device that includes a remaining portion of at least some of a plurality of probe pads, each side surface of said semiconductor device including a beveled surface that is beveled relative to a top surface of said semiconductor device and including a non-beveled surface, said non-beveled surface adjoining said beveled surface and extending to a bottom surface of said semiconductor device some of said remaining portion of at least some of a plurality of probe pads extending within said beveled surface.

5. A semiconductor device having side surfaces that include a beveled surface and a non-beveled surface said beveled surface beveled relative to a top surface of said semiconductor device and adjoining said top surface, said beveled surface formed by cutting a notch within a semiconductor wafer using a first cutting blade having cutting surfaces disposed at an acute angle relative to the center axis of said first cutting blade so as to form an open area, said cutting surfaces removing portions of at least some of a plurality of probe pads and removing portions of at least some of a plurality of metal layers, no remaining portion of said plurality of probe pads disposed within said open area and no remaining portion of said metal layers disposed within said open area, said non-beveled surface formed by extending a second cutting blade into said open area, said non-beveled surface disposed below said beveled surface and extending to a bottom surface of said semiconductor device.

6. A semiconductor device that includes a remaining portion of at least some of a plurality of probe pads, each side surface of said semiconductor device including a beveled surface and a non-beveled surface, said beveled surface formed by cutting a notch within a semiconductor wafer using a first cutting blade having cutting surfaces disposed at an acute angle relative to a center axis of said first cutting blade so as to form an open area, said non-beveled surface formed by extending a second cutting blade into said open area, some of said remaining portion of at least some of a plurality of probe pads extending within ones of said beveled surfaces.

7. The semiconductor device of claim 6 wherein said semiconductor device includes a remaining portion of at least some of a plurality of metal layers that couple to said probe pads, some of said remaining portion of said plurality of metal layers extending within ones of said beveled surfaces.

8. The semiconductor device of claim 7 wherein said remaining portion of said plurality of metal layers does not extend within ones of said non-beveled surfaces.

9. A ball grid array device comprising:
 a ball grid array package substrate including a plurality of bonding pads that are electrically coupled to a ball grid array;
 a semiconductor device disposed on said ball grid array package substrate, said semiconductor device having a top surface and having side surfaces that are beveled relative to said top surface, each of said side surfaces including a beveled surface and a non-beveled surface, said beveled surface adjoining said top surface, said non-beveled surface adjoining said beveled surface and extending to a bottom surface of said semiconductor device, said semiconductor device including a plurality of bonding pads disposed within said top surface; and
 a plurality of wire bonds, each of said wire bonds coupled to one of said plurality of bonding pads of said semiconductor device and coupled to one of said plurality of bonding pads of said ball grid array package substrate.

10. The ball grid array device of claim 9 wherein said semiconductor device is directly attached to said ball grid array package substrate using adhesive.

11. The ball grid array device of claim 10 wherein only adhesive is disposed between said semiconductor device and said ball grid array package substrate.

12. The ball grid array device of claim 9 wherein each of said beveled surfaces are curved.

13. The ball grid array device of claim 9 wherein each of said beveled surfaces are disposed at a forty-five degree angle relative to said top surface.

14. The ball grid array device of claim 9 wherein each of said beveled surfaces are disposed at a sixty degree angle relative to said top surface.

15. The ball grid array device of claim 9 wherein said semiconductor device includes a remaining portion of at least some of a plurality of probe pads, some of said remaining portion of said plurality of probe pads extending within at least one of said beveled surfaces.

16. The ball grid array device of claim 15 wherein said semiconductor device includes a remaining portion of at least some of a plurality of metal layers that couple to said probe pads, some of said remaining portion of said plurality of metal layers extending within ones of said beveled surfaces.

17. A method for forming a ball grid array device comprising:
 forming structures over a semiconductor wafer said structures including scribe streets and including probe pads disposed within said scribe streets, said structure including metal layers that at least partially underlie said probe pads;
 making a first cut within said scribe streets using a first cutting blade having cutting surfaces dispose at an acute angle relative to a center axis of said first cutting blade so as to remove portions of at least some of said probe pads and so as to remove portions of at least some of said metal layers so as to expose an open area that does not contain any of said probe pads and that does not contain any of said metal layers;
 severing said wafer at said open area by extending a second cutting blade into said open area, wherein said first cutting blade and said second cutting blade are rotating cutting blades that are aligned in a common plane such that said making a first cut and said severing said wafer are performed sequentially in a single pass;
 coupling said semiconductor device to a ball grid array package substrate; and
 coupling a plurality of wire bonds to said semiconductor device and to said ball grid array package substrate so as to electrically couple said semiconductor device to said ball grid array package substrate.

18. A method for forming a ball grid array device comprising:
 forming structures over a semiconductor wafer said structures including scribe streets and including probe pads disposed within said scribe streets, said structure including metal layers that at least partially underlie said probe pads;
 making a first cut within said scribe streets using a first cutting blade having cutting surfaces disposed at an angle of sixty degrees relative to a center axis of said first cutting blade so as to remove portions of at least some of said probe pads and so as to remove portions of at least some of said metal layers, exposing an open area that does not contain any of said probe pads and that does not contain any of said metal layers;
 severing said water at said open area so as to form a semiconductor device;
 coupling said semiconductor device to a ball grid array package substrate; and
 coupling a plurality of wire bonds to said semiconductor device and to said ball grid array package substrate so as to electrically couple said semiconductor device to said ball grid array package substrate.

19. A method for forming a ball grid array device comprising:
 forming structures over a semiconductor wafer, said structures including scribe streets and including probe pads disposed within said scribe streets, said structure including metal layers that at least partially underlie said probe pads;
 making a first cut within said scribe streets using a first cutting blade having cutting surfaces disposed at an angle of forty-five degrees relative to a center axis of said first cutting blade so as to remove portions of at least some of said probe pads and so as to remove portions of at least some of said metal layers, exposing an open area that does not contain any of said probe pads and that does not contain any of said metal layers;
 severing said wafer at said open area so as to form a semiconductor device;
 coupling said semiconductor device to a ball grid array package substrate; and
 coupling a plurality of wire bonds to said semiconductor device and to said ball grid array package substrate so as to electrically couple said semiconductor device to said ball grid array package substrate.

* * * * *